(12) United States Patent
Min et al.

(10) Patent No.: US 8,497,559 B2
(45) Date of Patent: Jul. 30, 2013

(54) MRAM WITH MEANS OF CONTROLLING MAGNETIC ANISOTROPY

(75) Inventors: Tai Min, San Jose, CA (US); Po Kang Wang, San Jose, CA (US)

(73) Assignee: MagIC Technologies, Inc., Milpitas, CA (US)

( * ) Notice: Subject to any disclaimer, the term of this patent is extended or adjusted under 35 U.S.C. 154(b) by 452 days.

(21) Appl. No.: 11/973,751

(22) Filed: Oct. 10, 2007

(65) Prior Publication Data
US 2009/0096043 A1    Apr. 16, 2009

(51) Int. Cl.
*H01L 29/82* (2006.01)
*G11C 11/00* (2006.01)

(52) U.S. Cl.
USPC .......... 257/421; 257/422; 257/E21.665; 365/157; 365/158

(58) Field of Classification Search
USPC .......... 257/422, 421, E21.665; 365/157, 365/158, 171
See application file for complete search history.

(56) References Cited

U.S. PATENT DOCUMENTS

| | | | |
|---|---|---|---|
| 5,695,864 A | 12/1997 | Slonczewski | |
| 6,052,262 A | 4/2000 | Kamiguchi et al. | |
| 6,130,814 A | 10/2000 | Sun | |
| 6,532,164 B2 | 3/2003 | Redon et al. | |
| 6,665,155 B2 | 12/2003 | Gill | |
| 6,809,516 B1 | 10/2004 | Li et al. | |
| 6,847,547 B2 | 1/2005 | Albert et al. | |
| 6,868,002 B2 | 3/2005 | Saito et al. | |
| 6,970,376 B1 | 11/2005 | Fukuzumi | |
| 7,067,331 B2 | 6/2006 | Slaughter et al. | |
| 7,193,284 B2 | 3/2007 | Yagami | |
| 7,394,626 B2 * | 7/2008 | Fukumoto et al. | 360/324.2 |
| 2002/0117727 A1 | 8/2002 | Engel et al. | |
| 2004/0145850 A1 | 7/2004 | Fukumoto et al. | |
| 2005/0104102 A1 | 5/2005 | Fukuzumi | |
| 2005/0106810 A1 | 5/2005 | Pakala et al. | |
| 2005/0189574 A1* | 9/2005 | Nguyen et al. | 257/295 |
| 2006/0118842 A1 | 6/2006 | Iwata | |
| 2007/0047159 A1 | 3/2007 | Zhao et al. | |
| 2007/0096229 A1 | 5/2007 | Yoshikawa et al. | |

FOREIGN PATENT DOCUMENTS

WO    US 08/11579    11/2008

OTHER PUBLICATIONS

"Current-driven excitation of magnetic multi layers," by J.C. Slonczewski, Jrnl. of Magnetism and Magnetic Materials 159(1996) L1-L7, Elsevier, Jun. 1996.

"A novel Nonvolatile memory with Spin Torgue Transfer magnetization switching: Spin-RAM", by M. Hosomi et al, IDGM Paper by Sony, 4 pgs, Dec. 2005.

"Multilayer configuration for experiments of spin precession induced by a dc current", by L. Berger, Jrrl. of Applied Physics, vol. 93, No. 10, May 15, 2003, pp. 7693-7695.

* cited by examiner

*Primary Examiner* — Allison P Bernstein
(74) *Attorney, Agent, or Firm* — Saile Ackerman LLC; Stephen B. Ackerman

(57) ABSTRACT

A CPP MTJ MRAM unit cell utilizes transfer of spin angular momentum as a mechanism for changing the magnetic moment direction of a free layer. The strength of the switching field, $H_s$ of the cell is controlled by the magnetic anisotropy of the cell which, in turn, is controlled by a combination of the shape anisotropy and the stress and magnetostriction of the cell free layer. The coefficient of magnetostriction of the free layer can be adjusted by methods such as adding Nb or Hf to alloys of Ni, Fe, Co and B or by forming the free layer as a lamination of layers having different values of their coefficients of magnetostriction. Thus, by tuning the coefficient of magnetostriction of the cell free layer it is possible to produce a switching field of sufficient magnitude to render the cell thermally stable while maintaining a desirable switching current.

10 Claims, 3 Drawing Sheets

MRAM WITH MEANS OF CONTROLLING MAGNETIC ANISOTROPY

BACKGROUND OF THE INVENTION

1. Field of the Invention

This invention relates generally to a current perpendicular to plane random access memory (CPP-MRAM) cell formed as a magnetic tunneling junction (MTJ) using a spin transfer effect to change the magnetization of a free layer.

2. Description of the Related Art

The conventional magnetic tunneling junction (MTJ) device is a form of ultra-high magnetoresistive (MR) device in which the relative orientation of the magnetic moments of parallel, vertically separated magnetized layers, controls the flow of spin-polarized electrons tunneling through a very thin dielectric layer (the tunneling barrier layer) formed between those layers. When injected electrons pass through the upper layer they are spin polarized by interaction with the magnetic moment of that layer. The majority of the electrons emerge polarized in the direction of the magnetic moment of the upper layer, the minority being polarized opposite to that direction. The probability of such a polarized electron then tunneling through the intervening tunneling barrier layer into the lower layer then depends on the availability of quantum states within the lower layer that the tunneling electron can occupy. This number, in turn, depends on the magnetization direction of the lower electrode. The tunneling probability is thereby spin dependent and the magnitude of the current (tunneling probability times number of electrons impinging on the barrier layer) depends upon the relative orientation of the magnetizations of magnetic layers above and below the barrier layer. The MTJ device can therefore be viewed as a kind of multi-state resistor, since different relative orientations (e.g. parallel and antiparallel) of the magnetic moments will change the magnitude of a current passing through the device. In a common type of device configuration ("spin filter"), one of the magnetic layers has its magnetic moment fixed in direction (pinned) by exchange coupling to an anti-ferromagnetic layer, while the other magnetic layer has its magnetic moment free to move (the free layer). The magnetic moment of the free layer is then made to switch its direction from being parallel to that of the pinned layer, whereupon the tunneling current is large, to being antiparallel to the pinned layer, whereupon the tunneling current is small. Thus, the device is effectively a two-state resistor. The switching of the free layer moment direction (writing) is accomplished by external magnetic fields that are the result of currents passing through conducting lines adjacent to the cell.

FIG. 1 is a highly schematic drawing showing an overhead view of a conventional MRAM cell between orthogonal word (200) and bit (100) lines. The cell (10) is drawn with a slightly elliptical horizontal cross-section because such a shape anisotropy produces a magnetic anisotropy within the free layer that assists its magnetic moment in retaining a thermally stable fixed position after switching fields have been turned off. According to the diagram, the word line field will be along the short or "hard" axis of the cell, the bit line field will be along the easy axis (the longer axis of the ellipse) along which the magnetic moment of the cell spontaneously forms.

For MRAM applications, the MTJ element is usually formed with shape anisotropy as shown in FIG. 1. Shape anisotropy occurs when the horizontal cross-sectional shape deviates from circular and becomes elliptical. When such an elliptical cell is in its quiescent state (not being activated by a switching current), the magnetization of the free layer lies along the longer (easy) axis of the cell. Within this easy axis direction, the free layer magnetization can be directed along the magnetization direction of the pinned layer or opposite to it, i.e., either parallel or anti-parallel to the pinned layer magnetization. In the parallel mode, the cell resistance is minimum, in the anti-parallel mode the cell resistance is maximum. Thus, the storage of digital information is provided by the magnetization direction of the free layer. The field required to switch the free layer magnetization from parallel to anti-parallel mode is called the switching field, $H_s$, and its value is a function of the magnetic anisotropy energy of the cell element.

In the conventional (non-spin transfer) MRAM application, two orthogonal external fields are used to program the MRAM cell. These fields are provided by the current carrying bit and word lines between which the cell is positioned. Referring to FIG. 2, there is shown schematically an array of cells (10) positioned at the intersections of orthogonally directed word (200) and bit (100) lines. The easy axes of the cells are along the direction of the word lines, so it is the magnetic field produced by the bit lines that is along the direction of the easy axis, while the magnetic field of the word line is along the perpendicular hard axis. To switch the magnetization direction of a selected cell, both fields are required to be "on" at the position of the selected cell. The combination of the two fields will be sufficient to overcome the energy of the shape anisotropy that maintains the cell magnetization in its quiescent direction. In the figure, arrows indicate the particular word and bit lines that are carrying current. The cell (101), shown darkened, that is at their intersection is the selected cell and its magnetization will be switched. However, there are many cells that lay beneath the active bit and word lines that are still experiencing partial fields, though, in principle, fields that are insufficient to achieve the required switching. Those cells can still, however, be accidentally programmed, causing an error. Such cells are referred to as being half-selected and are shown as shaded in the figure. The fact that such an array of crossed word and bit lines can produce unwanted cell switching is a problem associated with the use of externally generated magnetic fields to switch MRAM cells. Another problem associated with externally generated magnetic fields is the problem of scaling, which is to say that as the cells become smaller so must the current carrying lines and this requires the passage of higher currents through lines of greater resistance, increasing the power consumption of the circuit.

For this reason, a new type of magnetic device, called a spin transfer device and described by Slonczewski, (U.S. Pat. No. 5,695,164) and by Redon et al. (U.S. Pat. No. 6,532,164) has been developed and seems to eliminate some of the problems associated with the excessive power consumption necessitated by external switching fields. The spin transfer device shares some of the operational features of the conventional MTJ cell described above, except that the switching of the free layer magnetic moment is produced by the spin polarized current itself. In this device, unpolarized conduction electrons passing through a first magnetic layer having its magnetic moment oriented in a given direction (such as the pinned layer) are preferentially polarized by their passage through that layer by a quantum mechanical exchange interaction with the polarized bound electrons in the layer. Such a polarization can imposed on conduction electrons that reflect from the surface of the magnetized layer as well as to those that pass through it. When such a stream of polarized conduction electrons subsequently pass through a second magnetic layer whose polarization direction is not fixed in space (such as the free layer), the polarized conduction electrons exert a torque on the bound electrons in the magnetic layers which, if sufficient, can reverse the polarization of the bound electrons and, thereby, reverse the magnetic moment of the magnetic layer. If the magnetic moment of the layer is directed along its easy magnetic axis, the required torque is minimized and the moment reversal occurs most easily. The use of a current internal to the cell to cause the magnetic moment reversal requires much smaller currents than those required to produce an external magnetic field from adjacent current carrying lines to produce the moment switching. Recent experiments confirm earlier theoretical predictions (J. C. Slonczewski, J. Magn. Mater. 159 (1996) LI, M. Hosomi et al., IDEM, 2005 and L. Berger, Journ. Appl. Phys., 93 (2003), 7693).

Referring to FIG. 3, there is shown a schematic illustration of an exemplary prior art STT-MTJ element being contacted from above by a bit line (100) and from below by a bottom electrode (300). Moving vertically upward, there is shown a seed layer (1), an antiferromagnetic pinning layer (2), a synthetic antiferromagnetic (SyAF) pinned reference layer (345), consisting of a first ferromagnetic layer (3), a non-magnetic spacer layer (4) and a second ferromagnetic layer (5), a non-conducting tunneling barrier layer (6), a ferromagnetic free layer (7) and a non-magnetic capping layer (8). Arrows, (20) and (30), indicate the antiparallel magnetization directions of the two ferromagnetic layers (3) and (5) of the SyAF pinned layer (345). The double-headed arrow (40) in layer 7 indicates that this layer is free to have its magnetic moment directed in either of two directions.

Referring again to FIG. 3 it is noted that when a critical current (arrow (50) is directed from bottom to top (layer (1) to layer (8)), the free layer magnetization (40) would be switched to be opposite to the direction of the reference layer's magnetization (30) by the spin-transfer torque. This puts the MTJ cell into its high resistance state.

Conversely, if the current is directed from top to bottom (60), the free layer magnetization (40) would be switched, by torque transfer of angular momentum, to the same direction as that of the pinned reference layer (30), since the conduction electrons have passed through that layer before entering the free layer. The MTJ element is then in its low resistance state.

Referring again to FIG. 3, there is shown some additional circuitry, specifically a transistor (500) to inject current into the cell element whenever the cell element is selected to be written upon. The transistor is electrically connected to the cell through a conducting via (80) which allows a current to pass vertically between the bottom electrode (300) and the bit line (100). The word line (200), which can contact the transistor gate, activates the transistor so as to inject the writing current. In this way one can create a single spin-RAM memory cell that utilizes the spin transfer effect (denoted hereinafter as an STT-RAM) for switching an MTJ type element. In this paper, we will use the term "element" to describe the basic MTJ structure comprising a tunneling barrier layer sandwiched between ferromagnetic fixed and free layers. We shall use the term "memory cell" to denote the combination of the MTJ element incorporated within circuitry that permits the element to be written on and read from. The word line provides the bit selection (i.e., selects the particular cell which will be switched by means of a current passing through it between the bit line and the source line) and the transistor provides the current necessary for switching the MTJ free layer of the selected cell. Although it is not shown in this simplified figure, the cell is "read" (i.e., its resistance value is determined) by applying a bias voltage between the bit line and source line, thereby measuring its resistance and comparing that resistance with a standard cell in the circuit.

The critical switching current is given by:

$$I_c = CM_s^2 V,$$

where C is a constant, $M_s$ is the spontaneous magnetization of the free layer and V is the cell volume, V=At, where A is the horizontal cross-sectional area of the cell and t is its thickness. From this equation it is clear that the switching current scales down with the cell dimensions. However, as the dimensions become smaller, thermal agitation may perturb the stored information (i.e., change the magnetization of the free layer). The effect of thermal agitation is given by the equation:

$$f = f_0 \exp\{-BH_s M_s V/kT\},$$

where f is the thermal switching frequency, $f_0$ and B are constants, k is Boltzmann's constant and T is the temperature. For the stored information to be thermally stable (low switching frequency, f) the numerator of the exponentiated fraction, $BH_s M_s V$, must exceed a certain constant value. As the dimensions of the cell scale down, the area factor, A, in the volume V=At decreases, so to maintain the value of the numerator, $H_s$ and/or $M_s t$ must increase. But increasing $M_s t$ will increase $I_c$, which is undesirable. So increasing $H_s$ is a better choice. Usually $H_s$ is provided by the shape anisotropy of the cell, for example, for an elliptical shaped cell $H_s = DM_s tA_r$, where D is a constant and $A_r$ is the aspect ratio of the ellipse, the ratio of the long axis to the short axis. To utilize the shape anisotropy, the value of $H_s$ can be increased either by increasing $M_s t$ or $A_s$. Neither of these is desirable, since increasing $M_s t$ increases $I_c$ and increasing $A_r$ will increase cell size.

Clearly a method is needed to increase $H_s$ without encountering the disadvantages of either increasing $I_c$ or increasing cell size. A way of doing this can be provided by utilizing the combination of two phenomena that affect the magnetic anisotropy of the free layer of an MTJ cell: 1) an anisotropy that results from stress and magnetostriction of the free layer that, in turn, is a function of its material composition, its method of formation and the effects of its surroundings, and 2) the effects of shape-induced anisotropy that gives rise to a magnetic anisotropy. The prior art has applied the effects of magnetostriction to controlling the properties of spin-valve type GMR devices. The following are prior art patents and published applications that teach these effects.

Fukuzumi (U.S. Pat. No. 6,970,376), Engel et al. (US Pub. Patent Application 2002/0117727), Iwata (US Pub. Patent Application 2006/0118842), Pukala et al. (US Pub. Patent Application 2005/0106810) and Fukuzumi (US Pub. Patent Application 2005/0104102) discuss the control of magnetostriction and stress.

Fukumoto et al. (US Pub. Patent Application 2004/0145850) discloses a layer of $Ni_x Fe_{1-x}$ where x is controlled below 0.82 to adjust magnetostriction. Stress is also adjusted.

Slaughter et al. (U.S. Pat. No. 7,067,311) discloses choosing the Co to Fe ratio in CoFeB to control magnetostriction.

Saito et al. (U.S. Pat. No. 6,868,002) teaches that magnetostriction can be set to zero by adjusting the ratio of elements in the magnetic film.

Albert et al. (U.S. Pat. No. 6,847,547) shows that a small concentration of non-magnetic materials can be doped into the free layer to optimize magnetostriction.

Li et al. (U.S. Pat. No. 6,809,516) teaches controlling magnetostriction of a FeCo alloy can be achieved by controlling its composition and annealing processes.

Kamiguchi et al. (U.S. Pat. No. 6,052,262) discloses controlling magnetostriction via the composition of a NiFe alloy.

Zhao et al. (US Pub. Patent Application 2007/0047159) teaches controlling the magnetostriction of the free layer by varying the composition or thickness of layers.

Sun (U.S. Pat. No. 6,130,814) describes magnetic moment switching using spin transfer.

Gill (U.S. Pat. No. 6,665,155) describes a combination of a layer with positive magnetostriction and a layer with negative magnetostriction as a means of adjusting the total magnetostriction.

What is needed is a method of applying shape anisotropy, combined with the effects of stress and magnetostriction to spin transfer type MRAM cells to control their overall magnetic anisotropy.

SUMMARY OF THE INVENTION

A first object of this invention is to provide a CPP-MTJ configured MRAM device of the spin transfer variety in which the switching field, $H_s$, of the free layer is controlled primarily by stress and magnetostriction.

A second object of the present invention is to provide such a device in which the effects of shape anisotropy, and stress and magnetostriction induced anisotropy are combined to produce a switching field, $H_s$ that minimizes the effects of thermal agitation.

These objects will be met by a MRAM spin transfer device design in which a significant portion of free layer magnetic anisotropy will be provided by stress on the free layer and the magnetostriction property of the free layer. The magnetic anisotropy, $H_{k\sigma}$, produced by stress and magnetostriction is given by $H_{k\sigma}=3/2(\lambda\sigma)$, where $\lambda$ is the coefficient of magnetostriction of the free layer and $\sigma$ is the stress on the free layer. The $\sigma$ can be positive or negative, corresponding to tensile or compressive stress, and its value is strongly dependent on the free layer material composition, the method of its fabrication and the nature of its surrounding materials. In particular, the deposition of surrounding dielectrics can produce stresses due to differences in their rates of expansion or contraction. For example, FIG. 4 shows the outlines of two elliptical MTJ cells (10), (11) of the spin transfer variety formed underneath a bit line (100) that is directed nominally along a y-axis. The shape anisotropy of each cell would provide a magnetic anisotropy, $H_{ks}$, along the longer x-axis of the cell. The stress on the cell is assumed positive, meaning there is tensile stress along the y-axis. If the cell free layer is formed of a material like CoFeB with a positive $\lambda$, then the combination of the stress and the magnetostriction will produce a stress-induced anisotropy that is also along the positive x-axis. As a result of the combined action of these two sources of magnetic anisotropy, the total switching field, $H_{stotal}$ is given by: $H_{stotal}=H_{ks}+H_{k\sigma}$, which is the sum of shape induced magnetic anisotropy and stress/magnetostriction induced anisotropy. This field is along the x-axis as indicated by the arrows. As we shall discuss below, these two anisotropies are independent and the stress-induced anisotropy need not be directed along the same direction as the shape induced anisotropy. Moreover, the stress induced anisotropy can, by itself, provide a sufficient switching field, $H_s$, to maintain the thermal stability of the MTJ cell and the value of the stress induced anisotropy can be controlled independently of the values of $M_s t$ or the cell's aspect ratio $A_r$.

The stress sign and value can be controlled by the material and processing of the MTJ cell as well as the materials and process steps that are in proximity to the MTJ cell, such as high-k dielectrics, bit lines and the like. The sign and value of the magnetostriction can be controlled by the atomic composition of the free layer material and other structures in the MTJ film. It is noted that the magnetostriction is only weakly dependent on layer thickness.

In a compact design configuration it is advantageous to have the long axis of the ellipse lie along the direction of the bit line. FIG. 5 is a schematic illustration of a bit line (100) beneath which are two exemplary spin transfer MTJ cells (10), (11). These cells are ellipses in their horizontal cross-section and their long axes are in the y-axis direction, so the shape induced anisotropy is in the y-direction. For the configuration shown we shall assume that the stress is tensile (positive) and along the x-axis as was the case in FIG. 4. We shall also assume a positive value of $\lambda$, so the stress induced anisotropy is along the x-axis. Thus, there is a competition between the two directions of anisotropy and if $H_{k\sigma}>H_{ks}$, the anisotropy will be substantially along the x-axis (arrows)

If we refer to FIG. 6, we see a bit line (100) in the y-direction over two exemplary spin transfer MTJ cells (10), (11) having their long axes also along the y-directions, Thus, their shape induced anisotropy is in the y-direction. On the assumption that their stress is tensile and along the x-axis, but their coefficient of magnetostriction, $\lambda$, is negative, the net magnetic anisotropy will be along the y-axis (arrows). We shall see below how the sign and value of $\lambda$ can be varied so that use can be made of the results of formations such as those described in FIG. 4, FIG. 5 and FIG. 6.

DESCRIPTION OF THE PREFERRED EMBODIMENTS

The preferred embodiment of the present invention is an MRAM cell of the spin-transfer variety, having a CPP-MTJ configuration and including a free layer whose switching field, $H_s$ is a result of a magnetic anisotropy produced by a combination of shape anisotropy and stress-induced magnetostriction. The pinned layer can be a single layer of ferromagnetic material or a synthetic (SyAP) antiferromagnetic layer. As noted above, during operation of the cell, the passage of a current perpendicularly through the free layer produces a torque induced switching of the free layer magnetization due to the interaction of the spins of the conduction electrons with the magnetic moment of the free layer. The torque must be sufficient to switch the magnetization direction, against the countering effect of the switching field. Once the switch is complete, the same switching field provides sufficient magnetic energy to the magnetic moment configuration to stabilize the magnetization against thermal agitation.

Figure 1:
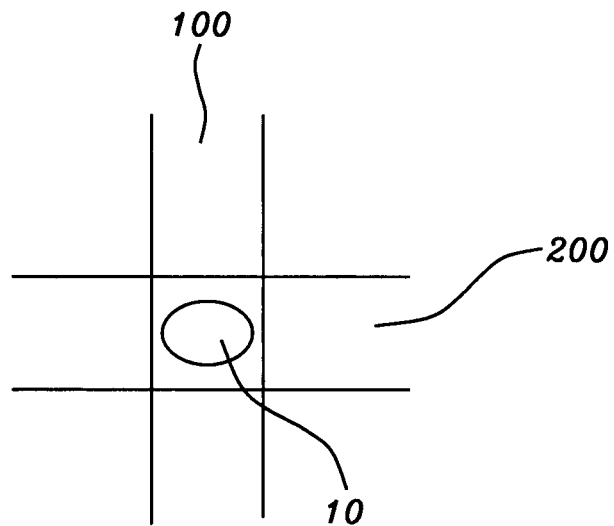
FIG. 1 is a schematic representation of a prior-art MTJ MRAM device located at the junction of word and bit lines.
Figure 2:
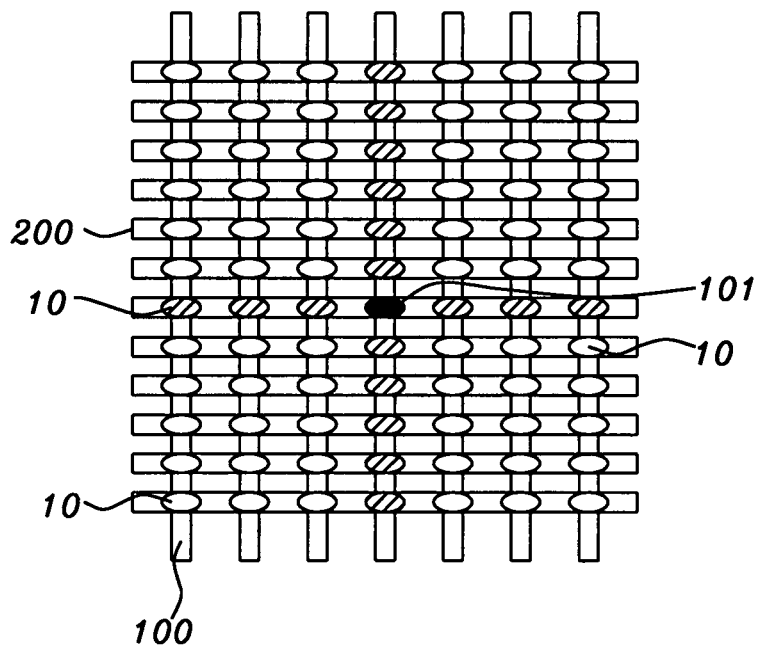
FIG. 2 is a schematic representation of an array of prior-art MTJ MRAM devices located at orthogonal intersections of current carrying lines.
Figure 3:
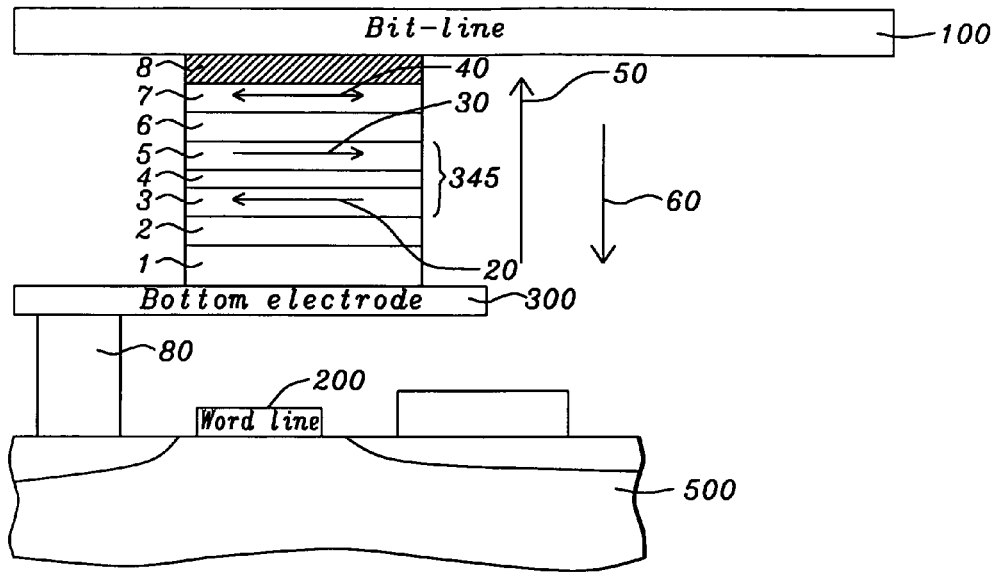
FIG. 3 is a schematic cross-sectional view of a typical prior art spin transfer device such as that whose magnetic anisotropy is to be controlled by methods of the present invention.
Figure 4:
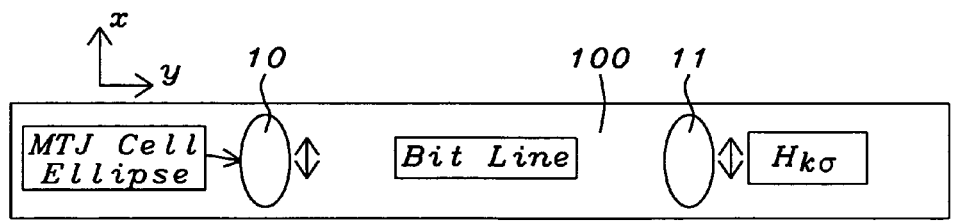
FIG. 4, FIG. 5 and FIG. 6 are schematic representations illustrating the effects of shape, stress and magnetostriction on the overall magnetic anisotropy of an MTJ cell of the spin-transfer type such as that shown if FIG. 3.
Figure 5:
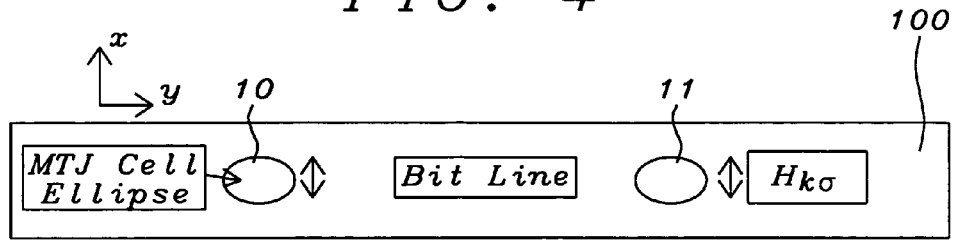
Figure 6:
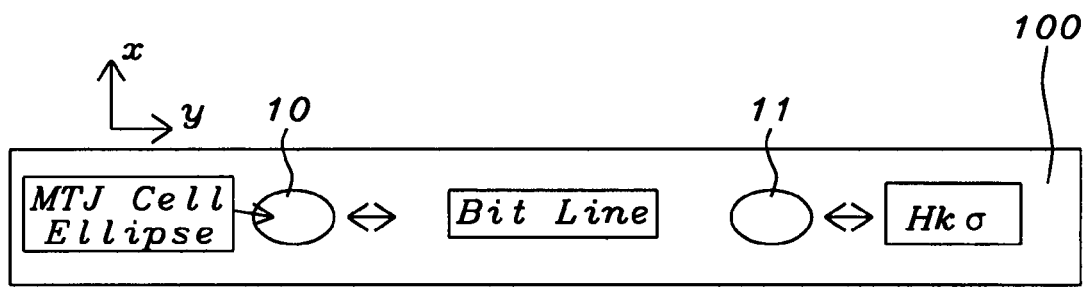
Figure 7:
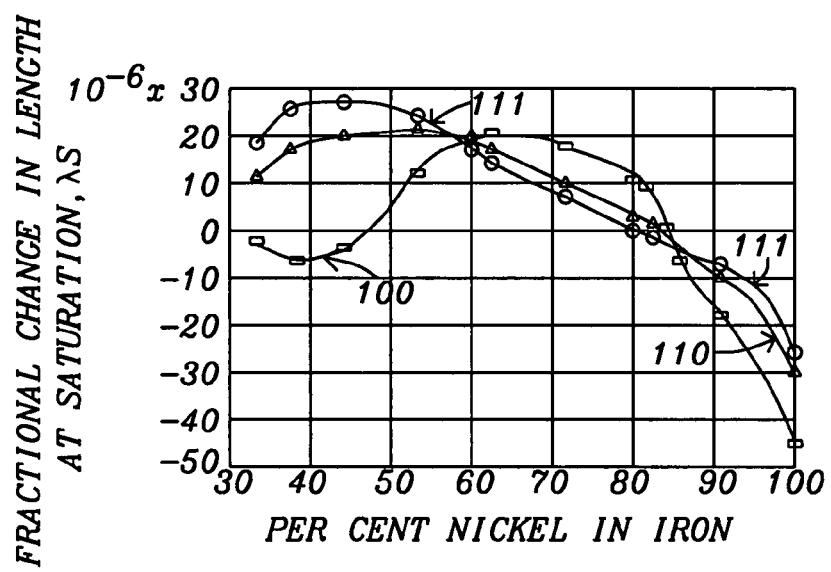
FIG. 7 is a graph showing the variation of $\lambda$ for various NiFe compositions.

The ability to control the coefficient of magnetostriction, $\lambda$, of a free layer or to control the nature of the stress applied to the free layer allows its magnetic anisotropy $H_k$ and, therefore, it switching field, $H_s$, to be controlled. This offers another method of designing a thermally stable MTJ cell with a desired switching current for use in a spin transfer type MRAM cell. The value of λ is a strong function of the amounts of Ni, Fe and Co forming the free layer. As an example, the graph in FIG. 7 shows the variation of λ as a function of composition of an NiFe alloy with various crystalline structures. As can be seen in the graph, a composition of the form $Ni_xFe_{1-x}$ with x approximately 0.8 (or 80%) allows λ to be tuned so that it is positive, negative or near zero.

In order to have a high value of the magnetoresistive coefficient DR/R, a cobalt-iron alloy doped with boron (CoFeB) may be used in the free layer, especially in an MTJ element having a MgO tunneling barrier layer. Prior art shows that such a free layer and tunneling barrier layer can produce a DR/R of up to 270%.

The present invention proposes a free layer comprising CoFeB, which typically has a high positive λ. To obtain the desired value of λ, the free layer is formed as a composite film layer of such as CoFeB/[Co, Ni, Fe, X] which is to say a layer of CoFeB formed on a layer comprising Co, Ni, Fe, in combination with element X, which can be hafnium and/or niobium. Adding Nb to Co, Fe, Ni alloys will shift λ to negative values, while adding Hf shifts λ to positive values. For example, the λ of $Co_{95}Nb_5$ will be very negative, so the λ of a composite free layer of the form $CoFeB/Co_{95}Nb_5$ can be negative, depending on the relative thickness of the two layers. Other film compositions, such as $Co_{92}Nb_3Hf_3$, CoFeNb, CoFeNbHf, CoFeBNb, or CoFeBNbHf can all be used to tune the composite free layer, as can a layer of NiFe. Equivalently, the objects of the invention can be met by forming a single layer of $Ni_xFe_{1-x}$ with x>0.8 or by forming a layer of $(Ni_{70}Fe_{30})_{1-x}Cu_x$ with x>0.15, or by forming a composite film comprising a layer with positive λ formed on a layer with negative λ. An example of such a bilayer is $CoFeB/Co_{95}Nb_5$. Alternatively, the objects of this invention can also be met by changing the stress applied to the free layer. This can be done by varying the nature of the materials in proximity to the MTJ cells, such as surrounding dielectric layers and particularly high-k (high dielectric constant) dielectric materials. In general, by combining a free layer material having an appropriate value of λ, with a properly applied stress produced by surrounding materials together with a shape anisotropy (as needed), a cell with the desired value of magnetic anisotropy and switching field can be produced.

As is finally understood by a person skilled in the art, the preferred embodiments of the present invention are illustrative of the present invention rather than limiting of the present invention. Revisions and modifications may be made to methods, materials, structures and dimensions employed in forming and providing a spin transfer CPP MTJ, MRAM cell device having its magnetic anisotropy formed as a result of combining the effects of shape anisotropy and anisotropy due to stress and magnetostriction, while still forming and providing such a device and its method of formation in accord with the spirit and scope of the present invention as defined by the appended claims.

What is claimed is:

1. A spin transfer MTJ MRAM cell comprising:
    an MTJ cell including a non-magnetic tunneling barrier layer formed between a magnetically pinned layer having a fixed magnetization and a magnetically free layer having a switchable magnetization;
    wherein said free layer has a shape anisotropy in a plane of said free layer and;
    wherein said free layer is surrounded by material;
    wherein said free layer is under a tensile or compressive stress in the plane of said free layer produced substantially by residual tensile or compressive stresses caused by differential expansion and contraction of said surrounding material and;
    wherein said free layer is formed having a material composition and structure that can be varied during said formation and wherein said free layer has a coefficient of magnetostriction, λ that depends upon said free layer material composition and structure, whereby, upon the exertion of said stresses
    said free layer acquires a total in-plane magnetic anisotropy, $H_{ktotal}$, that may include a shape induced magnetic anisotropy, but is most predominantly an anisotropy due to stress and magnetostriction and whereby said MTJ cell acquires, thereby, an in-plane switching field, $H_s$, that has a component resulting from said shape induced anisotropy and a component resulting from said stress induced anisotropy whereby
    a perpendicularly directed critical current is able to switch the direction of magnetization of said free layer, but
    the magnitude of the switching field maintains the resulting magnetization of said free layer constant and free from variations caused by thermal agitation in the absence of said critical current.

2. The cell of claim 1 wherein said free layer is a ferromagnetic alloy comprising the elements Fe, Co, Ni, B, wherein the atomic proportions of the alloyed elements determine the coefficient of magnetostriction, λ, of the layer.

3. The cell of claim 1 wherein said free layer is a ferromagnetic alloy comprising the elements Fe, Co, Ni, B with the addition of either Cu, Hf or Nb or combinations of Cu, Hf and Nb, wherein the atomic proportions of the alloyed elements determine the coefficient of magnetostriction, λ, of the layer.

4. The cell of claim 1 wherein said free layer is a composite ferromagnetic structure formed as a lamination of ferromagnetic layers wherein each layer has a different coefficient of magnetostriction from the other layers, whereby the overall coefficient of magnetostriction of the free layer is determined by adjusting the coefficients of magnetostriction of each layer forming the laminate and by adjusting the relative thickness of each said layer.

5. The cell of claim 1 wherein the free layer is formed as a layer of $Ni_xFe_{1-x}$ with x between approximately 0.25 and 1.

6. The cell of claim 1 wherein the free layer is formed as a layer of $Co_xFe_{1-x}B_y$ with x between approximately 0.25 and 1 and y between approximately 0 and 0.5.

7. The cell of claim 1 wherein the free layer is formed as bilayer of $Co_xFe_{1-x}B_y/Ni_zFe_{1-zx}$ with x between approximately 0.25 and 1, y between approximately 0 and 0.5 and z between approximately 0.7 and 1.

8. The cell of claim 1 wherein the free layer is formed as bilayer of $Co_xFe_{1-x}B_y/(Ni_{70}Fe_{30})_{1-z}Cu_z$ with x between approximately 0.25 and 1, y between approximately 0 and 0.5 and z between approximately 0.15 and 0.25.

9. The cell of claim 1 wherein the free layer is formed as bilayer of $Co_xFe_{1-x}B_y/U_zV_{1-z}$, where U is Co, Ni, Fe, B oar their alloys and V is Nb, Hf or their alloys, with x between approximately 0.25 and 1, y between approximately 0 and 0.5 and z between approximately 0.7 and 1.

10. The cell of claim 1 wherein said surrounding material is high-k dielectric material.

* * * * *